United States Patent [19]

Kim

[11] Patent Number: 5,296,092
[45] Date of Patent: Mar. 22, 1994

[54] PLANARIZATION METHOD FOR A SEMICONDUCTOR SUBSTRATE

[75] Inventor: Chunghoan Kim, Kyunggi-do, Rep. of Korea

[73] Assignee: Samsung Electronics Co., Ltd., Kyunggi-do, Rep. of Korea

[21] Appl. No.: 876,622

[22] Filed: Apr. 30, 1992

[30] Foreign Application Priority Data

Jan. 16, 1992 [KR] Rep. of Korea .................. 92-576

[51] Int. Cl.$^5$ .......................................... H01L 21/306
[52] U.S. Cl. .................................. 156/643; 156/653;
156/656; 156/657; 156/659.1; 437/228;
437/229; 437/231; 437/978
[58] Field of Search ............... 156/653, 643, 656, 657,
156/659.1; 437/228, 229, 231, 978

[56] References Cited

U.S. PATENT DOCUMENTS

| | | | |
|---|---|---|---|
| 4,952,274 | 8/1990 | Abraham | 156/653 |
| 5,006,485 | 4/1991 | Villalon | 156/653 |
| 5,139,608 | 8/1992 | Grivna | 156/643 |

FOREIGN PATENT DOCUMENTS 1-94623  4/1989  Japan .................. 437/978

OTHER PUBLICATIONS

Translation of Shimizu JP 1-094623.
Wolf, Silicon Processing for the VLSI Era, vol. 2, Lattice Press, Sunset Beach, (1990) pp. 222-235.
L. Molnar et al., "SOG Planarization Proves Better than Photoresist Etch Back," Semiconductor International, Aug. 1989, pp. 92-96.

Primary Examiner—Brian E. Hearn
Assistant Examiner—Laura M. Holtzman
Attorney, Agent, or Firm—Cushman, Darby & Cushman

[57] ABSTRACT

Disclosed is a method for planarizing the insulating layer formed on a semiconductor substrate without forming voids. An insulating layer is coated on a semiconductor substrate on which a metal wiring layer has been previously formed, and then a resist layer serving as a sacrificial layer is formed on the insulating layer. Etching the sacrificial layer provides a sacrificial residue on the insulating layer between portions of the metal wiring layer. After an upper portion of the insulating layer is istropically etched, the insulating layer and sacrificial residue are anisotropically etched. An insulating layer thus-obtained has a good profile so that a planarized insulating interlayer free of voids is obtained by an additional etch-back process using a second sacrificial layer. Consequently, a subsequent second metal wiring formation or lithography process can be easily carried out.

10 Claims, 2 Drawing Sheets

PLANARIZATION METHOD FOR A SEMICONDUCTOR SUBSTRATE

BACKGROUND OF THE INVENTION

1. Field of the Invention

The present invention relates to a method for manufacturing a semiconductor device, and more particularly to a method for planarizing an insulating interlayer to be used in conjunction with other multilevel interconnect technology.

2. Description of the Related Art

In order to manufacture an integrated circuit, it is necessary to form many active devices on a single substrate. Initially, each of the devices must be isolated from the others, but recently it has become necessary to electrically interconnect specific devices during the fabrication step to obtain the desired functionality of the circuit. Both MOS and bipolar VLSI and ULSI devices have multilevel interconnect structures to accommodate the numerous interconnections of the devices.

As the number of layers in an interconnect structure increase, the topography of the top layer coated on the semiconductor wafer becomes more rugged. For example, in manufacturing a semiconductor wafer having two or more metal layers formed thereon, a first insulating interlayer is coated on the wafer on which a plurality of oxide layers, poly crystalline silicon conductive layers and a first metal wiring layer, have been previously formed, followed by forming vias for interposing a second metal layer. The surface of the first insulating layer is uneven because the underlying structure upon which the first insulating layer has been formed is uneven. When a second metal layer is directly formed over such a first insulating interlayer, the second metal layer fractures due to peaks and/or cracks in the first insulating interlayer and, as a result, the metal coverage over the first insulating interlayer fails. This failure lowers the yield of the semiconductor device. Therefore, planarization of the insulating interlayer is required for multilevel metal interconnections, before forming a via or coating a second metal layer.

One of the simplest methods available for planarizing the semiconductor wafer having steps formed thereon is to deposit a CVD-glass layer which is significantly thicker than the step height it must cover. However, this is unrealistic because increasing the thickness of the insulating layer also increases the via depth between a first metal wiring layer and a second metal layer. Furthermore, as the first metal wiring layers become more closely packed, voids will form in the insulating layer if conventional CVD-SiO$_2$ processes are used.

One conventional planarization method as described by S. Wolf in *Silicon Processing for the VLSI Era. Vol. 2*, to form an exemplary insulating layer includes using a resist layer coated on an insulating interlayer as a sacrificial layer. The process comprises coating a resist layer and etching back the insulating interlayer by using the resist layer as a sacrificial layer to adjust the thickness of the insulating interlayer.

In the next step, the sacrificial resist layer is first rapidly etched back by dry etching until the topmost regions of the insulating interlayer are just barely exposed. The etch chemistry is then modified so that the sacrificial layer material and the insulating interlayer material are etched at approximately the same rate. Etching continues under these conditions until all of the sacrificial resist layer has been etched away. By this etch-back procedure, the surface of the insulating interlayer is highly planarized since the profile of the sacrificial layer is thus transferred to the insulating interlayer. In some cases, the thickness of the insulating interlayer over underlying metal layers may be thinner than desired after the etch-back step is completed. In other cases, etch-back is allowed to proceed until the first metal wiring layers are exposed for improving the degree of planarization. In such a case, an additional CVD insulating layer is generally deposited in order to establish the minimum adequate thickness of the insulating interlayer.

With the increase in integration density of semiconductor devices, the spaces between the metal layers become narrower. Therefore, various problems such as the formation of voids in the insulating interlayer occur, so its planarization becomes difficult to improve. To improve the degree of planarization of the insulating layer formed over such closely spaced metal layers, a method of repeating the etch-back step two times has been typically carried out.

FIGS. 1A to 1D illustrate a process for planarizing an insulating interlayer by two times etch-back.

FIG. 1A displays a first metal wiring layer 2 which has been formed on a semiconductor substrate 1 with a pattern as shown. A CVD-SiO$_2$ layer 3 is formed on the first metal wiring layer 2 and the semiconductor substrate 1 as illustrated in the figure. The final stage demonstrated in FIG. 1A is the formation of a resist layer 4 on top of the CVD-SiO$_2$ layer 3.

FIG. 1B demonstrates results of a first etching back-step of the resist layer 4 and the CVD-SiO$_2$ layer 3 shown in FIG. 1A. A CVD-SiO$_2$ layer 3a with spaces 9 between the first metal wiring layer 2 is the result of the first etching back-step. The spaces between the first metal wiring layer 2 are an undesirable side effect of the first etching back as will be discussed later.

FIG. 1C shows the effect of forming a second CVD-SiO$_2$ layer 5 upon the CVD-SiO$_2$ layer 3a shown in FIG. 1B. The CVD-SiO$_2$ layer 5 is formed in the same manner as was the CVD-SiO$_2$ layer 3a, thereby forming voids 7 in the spaces 9. A second resist layer 6 is then formed on the second CVD-SiO$_2$ layer 5 with the same techniques uses to form resist layer 4.

FIG. 1D demonstrates the results of a second etching back step of the second resist layer 6 and the second CVD-SiO$_2$ layer 5 shown in FIG. 1C. A planarized insulating layer 3b comprising CVD-SiO$_2$ is shown in this illustration with a planar top surface 8 and voids 7 which are the product of the second etching back step. A third CVD-SiO$_2$ layer (not shown in the drawings) may be formed on the planarized insulating layer 3b if the planarized insulating layer 3b does not meet minimum thickness specifications.

Accordingly, as exemplified, a planarized insulating interlayer 3 containing voids 7 may be fabricated. Trouble arises when the first CVD-SiO$_2$ layer 3 is formed and etched back by using a sacrificial resist layer 4. The first etch back generates negative-sloped spaces 9 in the first CVD-SiO$_2$ layer 3a making further layer formations difficult at the negative sloped spaces 9. Therefore, the formation of the second CVD-SiO$_2$ layer 5 contains undesirable voids 7.

SUMMARY OF THE INVENTION

It is therefore an object of the present invention to provide a method for planarizing an insulating interlayer which provides a good planarized surface thereof without forming any voids.

According to the present invention, a method for the planarization of a semiconductor substrate is provided which comprises the steps of:

coating an insulating layer on a semiconductor substrate on which metal wiring layers have been formed;

forming a sacrificial layer on the insulating layer;

etching the sacrificial layer so as to form a sacrificial residue on the insulating layer between the metal wiring layers, istropically etching the insulating layer; and anistropically etching the sacrificial residue and the insulting layer.

BRIEF DESCRIPTION OF THE DRAWINGS

Further features and advantages of the present invention will be apparent to those skilled in the art from the following detailed description, taken together with the accompanying drawings, in which.

DESCRIPTION OF THE PREFERRED EMBODIMENT

As shown in FIGS. 2A-2F, significant steps of a preferred embodiment of a planarization method for a semiconductor substrate in accordance with the present invention are illustrated.

Figure 1A:
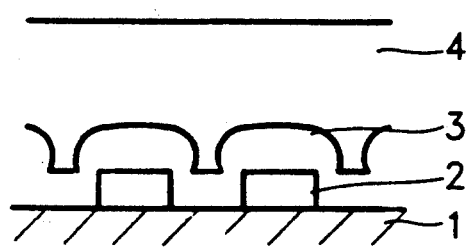
FIGS. 1 A to 1D illustrate a conventional method for planarizing an insulating interlayer formed on a semiconductor substrate.
Figure 1B:
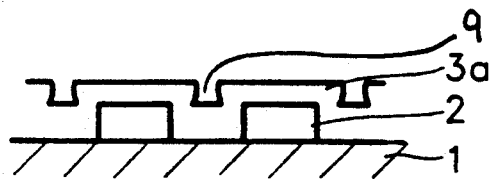
Figure 1C:
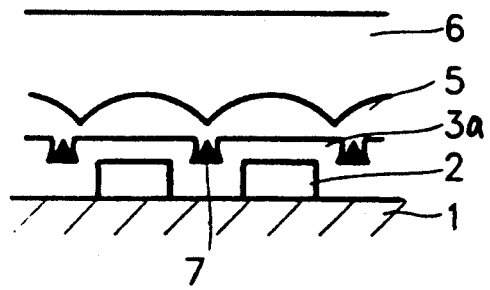
Figure 1D:
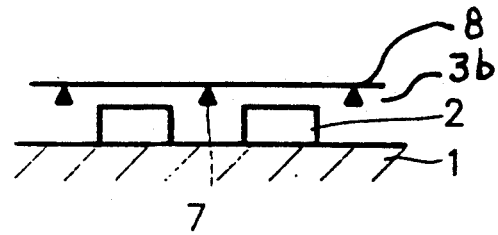
Figure 2A:
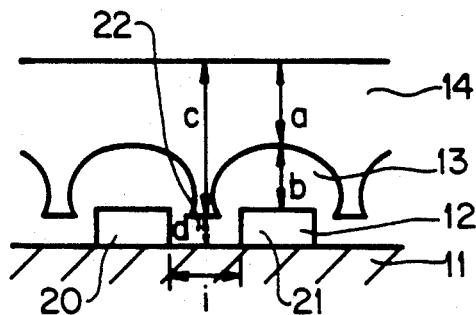
FIGS. 2A to 2F illustrate one embodiment of the planarizing method according to the present invention.

FIG. 2A illustrates results of forming a sacrificial layer 14 on a first insulating layer 13. The first insulating layer was previously formed on a semiconductor substrate 11 having a first metal wiring layer 12 with a pattern as shown. The first metal wiring layer 12 is comprised of portions 20 & 21 with a gap 22 between them.

At first, a metal layer (not shown) is formed with a thickness of 0.5 μm and etched to form the first metal wiring layer 12 on the semiconductor substrate 11 in the pattern shown. The metal layer may be formed, for example, by a sputtering method using an aluminum alloy such as Al-Si or Al-Si-Cu. Subsequently performing a conventional lithography process yields the metal wiring layer 12.

The first insulating layer 13 which commonly comprises $SiO_2$ is formed on the semiconductor substrate 11 and the previously formed first metal wiring layer 12. The first insulating layer 13 may be formed, for example, by a conventional CVD process using $SiO_2$. In this instance, the first insulating layer 13 comprising $SiO_2$ is formed, for example, at a temperature of 200°–400° C. by a PECVD method using $SiH_4$ and $N_2O$ or $O_2$ as a source. The first insulating layer 13 produced in this manner has a poor step coverage as can be seen from FIG. 2A. The probability of the formation of voids (as previously described) increases as the gap (i) between portions 20 & 21 of the first metal wiring layer 12 decreases. However, the first insulating layer 13 should be formed without any voids.

In a more discrete illustration, when the gap (i) between portions 20 & 21 of the first metal wiring layer 12 is 0.8 μm, the first insulating layer 13 comprising CVD-$SiO_2$ is deposited with a thickness b which is 0.8 μm above the first metal wiring layer 12 and a thickness d which is 0.3 μm above the semiconductor substrate 11 between the portions 20 & 21 of the first metal wiring layer 12. Nevertheless, the thickness b of the first insulating layer 13 may be varied according to the size (i) of the gap 22 between the portions 20 % 21 of the first metal wiring layer 12.

The resist layer 14 functioning as a sacrificial layer is deposited upon the previously formed first insulating layer 13. The resist layer 14 generally comprises photoresist material, since the resist layer 14 is to be sacrificed. The photoresist materials are inexpensive and pure, so they are optimal for the resist layer 14. However, polymide and spin-on-glass (SOG) are occasionally used anyway.

In the more discrete illustration, the gap 22 between portions 20 & 21 of the first metal wiring layer 12 is 0.8 μm, the resist layer 14 serving as a sacrificial layer optimally has an average thickness of approximately 1.22 μm, and more specifically, the thickness (c) of the resist layer 14 at the gap 22 between the portions 20 & 21 of the first metal wiring layer 12 is 2.1 μm and the thickness (a) at the first metal wiring layer 12 is 1 μm.

Figure 2B:
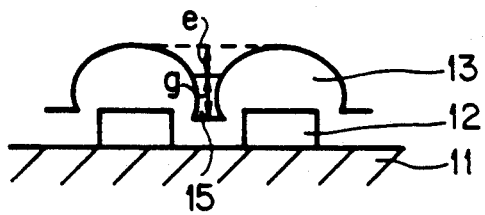

FIG. 2B illustrates the results of a step of etching the resist layer 14 serving as a sacrificial layer to form a sacrificial residue 15. When the resist layer 14 comprises a photoresist material, it is etched by dry etching with $O_2$ or $O_2$ mixed with $CF_4$ until an upper portion of the first insulating layer 13 above the first metal wiring layer 12 is exposed. The etching is stopped before all of the sacrificial layer 14 is removed, thereby leaving a sacrificial residue 15 above the gap 22. Only the sacrificial layer 14 is etched, so the first insulating layer 13 remains undisturbed. The total height of the sacrificial residue 15 is the thickness (g) etching of the sacrificial residue 15 plus the thickness (d) of the first insulating layer 13 in gap 22 (g+d). Thus, the height of the sacrificial residue 15 is lower than the height of the first insulating layer 13 above the first metal wiring layer 12. The optimal thickness (g) of the sacrificial residue 15 is dependent upon the amount of the sacrificial residue 15 to be further etched away in subsequent isotropic etching as further described in reference to FIG. 2C.

Figure 2C:
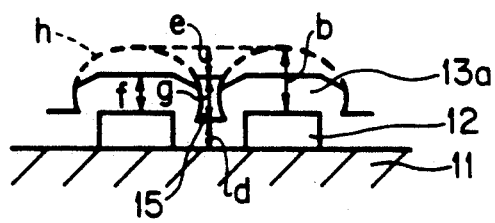

FIG. 2C exhibits the outcome of an isotropic etching of the first insulating layer 13 in FIG. 2B. The first insulating layer 13 with the original profile represented by h is etched back with a shape depicted by 13a (hereafter referred to as etched first insulating layer 13a). A difference between the top of the sacrificial residue 15 and the peak of the first insulating layer 13 before etching or the amount of the first insulating layer 13 etched away measured from peak-to-peak (i.e., the difference between peaks of 13 and 13a) is characterized by e. The height of the peak of the etched first insulating layer 13a is a thickness (j) of the first metal insulating layer 13a plus the thickness (f) of the peak of the etched first insulating layer 13a above the first metal wiring layer 12 (j+f). The height of the sacrificial residue 15 at the gap 22 (g+d) should be approximately equal to the height of the peak of the etched first insulating layer 13 (j+f) for optimal results (i.e., g+d−i+f). The arrangement after etching of the etched first insulating layer 13a and the sacrificial residue 15 facilitate better step coverage of subsequent insulating layers to be formed thereon.

Consequently, the amount of the sacrificial layer 14 to be etched away above the gap 22 is the thickness (a) of the sacrificial layer 14 above the first metal wiring layer 12 plus the thickness (b) of the first insulating layer 13 over the first metal wiring layer 12 minus the thickness (f) of the etched first insulating layer 13a or more simply a+(b−f). The amount of the sacrificial layer 14 and the first insulating layer 13(b) above the first metal wiring layer 12 is a+b and the thickness (f) is the amount of the first insulating layer 13 left after the etching process also. Under the exemplary conditions set forth in regards to FIG. 2A the value of a+(b−f) is approximately 1.30~1.40 μm. The thickness (g) of the sacrificial residue 15 after the isotropic etching for these conditions is about 0.7~0.8 μm also.

Figure 2D:
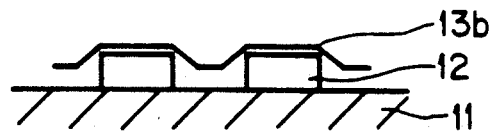

FIG. 2D demonstrates the results of a further anisotropic etching of the device shown in FIG. 2C. A second etched insulating layer 13b results from the anisotropic etching. When the height of the sacrificial residue 15 (g+d) is lower than the height of the peak of the etched first insulating layer 13a (j+f), a portion of the etched first insulating layer 13a around the bottom of the sacrificial residue 15 is not sufficiently etched by the anisotropic etching. In addition, when the height of the sacrificial residue 15 (g+d) is greater than the height of the peak of the etched first insulating layer 13a (j+f), the etched first insulating layer 13a is overetched. Therefore, it is important to form the sacrificial residue 15 to the correct height to obtain servicable results.

An etch selectivity of the sacrificial residue 15 with respect to the etched first insulating layer 13a is 3:1~5:1 according to a preferred embodiment of the present invention. If the selectivity is too low, then all of the etched first insulating layer 13a over the first metal wiring layer 12 will be etched away, since the anisotropic etching is continued until all of the sacrificial residue 15 is removed. On the other hand, if the selectivity is too high, the etched first insulating layer 13a at the gap 22 must be undesirably overetched in order to obtain a proper surface topology for subsequent insulation layer deposition thereon. Therefore, it is important that the etching selectivity remain within the preferred range during anisotropic etching. Likewise, the total amount of the insulating layer 13 which is removed is approximately 0.5~0.7 μm, therefore the thickness of the second etched insulating layer 13b above the first metal wiring layer 12 is about 0.15~0.35 μm.

Figure 2E:
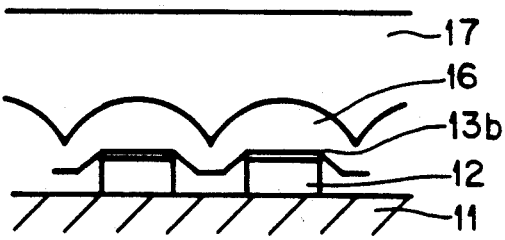

FIG. 2E illustrates the outcome of forming a second insulating layer 16 and a second sacrificial layer 17 upon the device depicted in FIG. 2D according to a preferred embodiment of the present invention. The second insulating layer 16 comprises SiO₂ and is formed to a thickness of approximately 4000~5000 Å in the same manner as the first insulating layer was formed. Optimally, the second sacrificial layer 17 comprises photoresist material and is formed to a thickness of about 1.20~1.24 μm in the same way as the sacrificial layer 14 was formed on the previously formed second insulating layer 16.

Figure 2F:

FIG. 2F displays results of a second etching back of the apparatus shown in FIG. 2E. An etch selectivity of the second insulating layer 16 to the second sacrificial layer 17 of 1:1 is used in an etching process to etch back the second sacrificial layer 17 and the second insulating layer 16 resulting in a planarized insulating layer 18. The planarized insulating layer 18 has a top surface 19 which has a planar topology. The thickness of the planarized insulating layer over the first metal wiring layer 12 is optimally about 1000~2000 Å according to the exemplary conditions set forth in regards to FIG. 2A. A third insulating layer (not shown) may be formed on the planar insulating layer 18 if its thickness is below 1000 Å.

According to the present invention, isotropic etching is performed before anisotropic etching of the insulating interlayer in a planarization method of an insulating interlayer formed on a semiconductor wafer. The CVD-SiO₂ layer as an insulating interlayer thus obtained after the etch-back step, has a good profile, so that no voids are formed in subsequent coating of the second insulating layer. If the method of the present invention is applied to a semiconductor wafer having metal wiring layers formed thereon with a gap of about 0.8 μm, a well-planarized insulating layer with no voids is formed, so that a step of forming second metal wiring layers or a lithography process can be easily performed thereafter; which improves the yield of a semiconductor wafer and increases the reliability of the semiconductor device.

While the invention has been described in connection with what is presently considered to be the most practical and preferred embodiment, it is to be understood that the invention is not to be limited to the disclosed embodiment but on the contrary, it is to cover various modifications and equivalent arrangements included within the spirit and scope of the appended claims.

Thus, it is to be understood that variations in the particular etching sequence, configuration and materials employed can be made without departure from the novel aspects of this invention as defined in the claims.

What is claimed is:

1. A method for the planarization of a semiconductor substrate comprising the steps of:
    (a) coating an insulating layer on a semiconductor substrate on which a metal wiring layer has been previously formed;
    (b) forming a sacrificial layer on said insulating layer;
    (c) etching said sacrificial layer forming sacrificial residues on said insulating layer between portions of said metal wiring layer;
    (d) isotropically etching said insulating layer; and
    (e) anisotropically etching said sacrificial residues and said isotropically etched insulating layer simulataneously.

2. A method as claimed in claim 1, wherein the method further comprises steps of:
    forming a second insulating layer and a second sacrificial layer; and
    etching back said insulating layer resulting in a planarized surface thereof, after said step (e).

3. A method as claimed in claim 2, further comprising the step of forming a third insulating layer on said planarized surface obtained after said etching back step.

4. A method as claimed in claim 1, wherein said insulating layer is a SiO₂ layer formed by a CVD method.

5. A method as claimed in claim 1, wherein said sacrificial layer is a resist layer, a polyimide layer or an SOG layer.

6. A method as claimed in claim 1, wherein said sacrificial layer is etched so that the height of said sacrificial residue is lower than that of said insulating layer over said metal wiring layers.

7. A method as claimed in claim 6, wherein said insulating layer is istropically etched so that the insulating layer over said metal wiring layer has the same height as that of said sacrificial residue.

8. A method as claimed in claim 1, wherein the etch selectivity of said sacrificial residue with respect to said insulating layer is 3:1~5:1 in anisotropic etching.

9. A method as claimed in claim 1, wherein a gap between portions of said metal wiring layer formed on said semiconductor substrate is about 0.8 μm.

10. A method for the planarization of a semiconductor substrate comprising the steps of:
(a) coating an insulating layer on a semiconductor substrate on which metal wiring layers have been formed, said insulating layer having a plurality of raised portions corresponding in position over said metal wiring layers;
(b) forming a sacrificial layer on said insulating layer;
(c) etching said sacrificial layer so as to form a plurality of sacrificial residues on portions of said insulating layer disposed between said metal wiring layers;
(d) isotropically etching said raised portions of said insulating layer to substantially eliminate said raised portions such that said insulating layer and said sacrificial residues are of approximately the same height relative to one another; and
(e) anisotropically etching said sacrificial residues and said isotropically etched insulating layer so that said insulating layer is provided with a substantially planar surface substantially withough voids therein.

* * * * *